United States Patent [19]

Ito et al.

[11] Patent Number: 4,552,833

[45] Date of Patent: Nov. 12, 1985

[54] RADIATION SENSITIVE AND OXYGEN PLASMA DEVELOPABLE RESIST

[75] Inventors: Hiroshi Ito; Scott A. MacDonald; Robert D. Miller; Carlton G. Willson, all of San Jose, Calif.

[73] Assignee: International Business Machines Corporation, Armonk, N.Y.

[21] Appl. No.: 609,690

[22] Filed: May 14, 1984

[51] Int. Cl.$^4$ .......................... G03C 5/16; G03C 1/72
[52] U.S. Cl. .................................... 430/325; 430/270; 430/313; 156/643
[58] Field of Search ............... 430/325, 313, 270, 311, 430/331; 156/643

[56] References Cited

U.S. PATENT DOCUMENTS

| | | | |
|---|---|---|---|
| 4,307,177 | 12/1981 | Crivello | 430/281 |
| 4,307,178 | 12/1981 | Kaplan et al. | 430/325 X |
| 4,389,482 | 6/1983 | Bargon et al. | 430/325 |
| 4,396,704 | 8/1983 | Taylor | 430/311 |
| 4,464,455 | 8/1984 | Yoneda et al. | 430/270 |
| 4,481,049 | 11/1984 | Reichmanis et al. | 156/643 |
| 4,481,279 | 11/1984 | Naito et al. | 430/270 |
| 4,517,276 | 5/1985 | Lewis | 430/331 X |

OTHER PUBLICATIONS

Gessner G. Hawley, *The Condensed Chemical Dictionary*, Tenth Edition, Van Nostrand Reinhold Company, New York, N.Y. 1981, pp. 920–921.

Julius Grant, Ed., *Hackh's Chemical Dictionary*, 4th Ed., McGraw-Hill Book Company, 1969, pp. 611, 476; 1944, p. 801.

W. S. DeForest, *Photoresist Materials and Processes*, McGraw-Hill, Inc., New York, N.Y., 1975, pp. 48–58.

F. G. A. Stone et al., Eds., *Advances in Organometallic Chemistry*, vol. 13, Academic Press, New York, N.Y., 1975, pp. 7, 32–33.

Henry Gilman et al., Eds., *Organic Chemistry: An Advanced Treatise*, Second Ed., vol. 1, John Wiley & Sons, Inc., New York, New York, 1943, p. 491.

*Primary Examiner*—John E. Kittle
*Assistant Examiner*—Cynthia Hamilton
*Attorney, Agent, or Firm*—Joseph G. Walsh

[57] ABSTRACT

A negative tone resist image is achieved by (1) coating a substrate with a film of a polymer containing a masked, reactive functionality; (2) imagewise exposing the film to radiation in a fashion such that the masked functionality is liberated; (3) contacting the film with an organometallic reagent; (4) developing the relief image by the oxygen plasma etching.

14 Claims, No Drawings

RADIATION SENSITIVE AND OXYGEN PLASMA DEVELOPABLE RESIST

DESCRIPTION

1. Technical Field

The present invention is concerned with a process for obtaining a resist which is radiation sensitive and oxygen plasma developable. The process eliminates the need for a solvent development step and results in a high resolution, submicron negative tone image.

2. Background Art

U.S. patent application Ser. No. 06/410,201, filed Aug. 23, 1982, U.S. Pat. No. 4,491,628 shows polymer and sensitizer systems which are particularly useful in the process of the present invention.

German patent application No. OS 32 15082 (English language counterpart GB No. 2097143) shows a process for obtaining negative tone plasma resist images. That publication is concerned with a process involving entrapment of a silicon containing monomer into a host film at the time of exposure to radiation and requires a processing step to expel the unincorporated silicon monomer from the film before plasma development of the relief image. The present process involves the selective introduction of an organometallic species into the exposed areas of the film, after irradiation.

U.S. Pat. Nos. 4,307,178; 4,389,482 and 4,396,704 disclose the use of oxygen plasmas in developing negative resist images. The materials used are obviously different from those used in the present process, and so are the process steps.

U.S. Pat. No. 4,307,177 shows the use of onium salts as sensitizers. The patent obviously does not teach the process steps of the present invention.

DISCLOSURE OF THE INVENTION

According to the present invention, a negative tone resist image is generated by carrying out the following steps:

1. A substrate is coated with a film of polymer bearing a masked reactive functionality;
2. The film is imagewise exposed and then processed so that the masking group is removed in the exposed areas to liberate the reactive functionality;
3. The film is then contacted with an appropriate organometallic reagent. This reagent is chosen so that it will react with the unmasked polymer functionality, and contains an element such as silicon or tin which forms a non-volatile oxide;
4. The film is then placed into an oxygen plasma environment. The unexposed areas of the film are etched by this oxygen plasma treatment but the exposed areas are not etched. This results in a high resolution, negative tone relief image.

The process employed in the present invention has several distinct and unpredictable advantages over negative tone resist processes that are known in the art. First, the process does not require a solvent development step and therefore has the advantage of being both simple and more environmentally acceptable in use. It has been demonstrated to operate at extremely low doses of exposing radiation and over a wide range of exposing wavelengths. These wavelengths include, but are not limited to, X-ray, electron beams and ultraviolet light from 220 to 450 nm. The images obtained from this process exhibit vertical wall profiles, and show minimal thickness loss in the exposed regions when processed in the prescribed manner.

The compositions used in the present invention can take several forms. In one embodiment, the masking group is directly removed upon exposure to radiation. The unmasked functionality which is generated in such a fashion is reactive toward several organo metallic reagents, while the masked polymer is not. Such materials, for example, include but are not restricted to poly(p-formyloxystyrene) and copolymers prepared from p-formyloxystyrene. In a second embodiment, the formulation consists of a polymer containing a reactive functionality that is masked by an acid labile protecting group and a species that is capable of generating acid upon exposure to radiation. In such systems, exposure or exposure followed by heat, serves to unmask the reactive functionality. Examples of such polymers include, but are not restricted to to poly(t-butyl methacrylate) and poly(t-butyloxycarbonyloxystyrene) and copolymers derived from t-butyl methacrylate or t-butyloxycarbonyloxystyrene. Examples of materials that produce acid upon exposure are well known in the art and include various onium salts and haloalkanes.

Organometallic reagents that are capable of selective reaction with the unmasked side chain functionality are well known in the art. A wide range of readily available organometallic reagents are useful in this process. These include, for example, but are not limited to trimethylstannyl chloride, hexamethyldisilazane and trimethylsilyl chloride. These reagents, which can be used in either an appropriate solvent or in the vapor phase, will react with unmasked functional groups such as —COOH,—OH,—NH$_2$ etc.

The development of the relief image uses oxygen plasma or reactive ion etching techniques that are performed in the conventional fashion.

The preferred polymers for use in the present invention are those having acid labile groups pendant from a polymer backbone. Particularly preferred are those in which such groups are esters of a carboxylic acid or a carbonic acid. Polymers of this sort are shown in U.S. patent application Ser. No. 06/410,201 mentioned above. That application also shows the onium sensitizers which are most preferred for use in the present invention. These include diaryliodonium salts, triarylsulfonium salts and substituted aryldiazonium salts. The most preferred gegenanions of the salts are complex metal halides such as tetrafluoroborate, hexafluoroantimonate, hexafluoroarsenate and hexafluorophosphate. In general, the sensitizer onium salt should be present in the polymers in an amount from about 1 to 100% on a weight to weight basis.

The preferred organometallic species, for use in the present invention are those that are capable of reacting with the unmasked pendant functionality. Particularly preferred are silylating reagents which are well known in the art and any suitable one may be used. As an example of a preferred reagent hexamethyldisilizane (HMDS) may be mentioned.

In one embodiment of the present invention, a thin film of polymer sensitized by the addition of an onium salt is used as an overcoat for a thick film of an organic polymer which need not be sensitized (the thick film is on a substrate such as silicon). In general, the thin sensitized, overcoating film is about 1$\mu$ thick, and the overcoated film about 4 to 6$\mu$ thick. In this way, high aspect ratio relief images are generated in a general organic film.

In another embodiment of the present invention, a dye is added to the thin film formulation. Dyes useful for this purpose include, for example, polycyclic aromatic compounds and their derivatives. Perlyene is a particularly useful dye.

The development step using oxygen reaction ion etching is carried out in conventional fashion.

THE PREFERRED EMBODIMENT

One μ thick films of p-t-butoxycarbonyloxystyrene (PBOCS) containing triphenylsulfonium hexafluoroarsenate (18.5% to the total solid) in methyl cellosolve acetate, were spin-coated onto silicon wafers and pre-baked at 100° C. for 30 minutes. The films were exposed through a mask to 254 nm radiation (dose: 14.4 mj/cm$^2$ or 5.0 mj/cm$^2$), baked at 100° C. for 30 seconds, and dried at 85° C. (0.2 mm Hg) for 1 hour in a vacuum oven. The oven was opened under nitrogen and a 50 ml beaker containing 10 ml of Hexamethyldisilazane (HMDS) was placed into the chamber. The oven was evacuated and filled with nitrogen and subsequently partially evacuated, to vaporize the HMDS. The wafers were allowed to stand at 85° C. in the HMDS vapor for one hour and were then transferred into a Tegal parallel-plate etch tool. The relief image was dry developed with 80 minutes of O$_2$-RIE (100 watts RF, 50 m torr, and 10 sccm O$_2$). After RIE development the processed wafers were dipped into dilute buffered HF and then rinsed with water. The relief images produced by this process had vertical wall profiles and showed high resolution.

We claim:

1. A process for generating a negative tone resist image comprising the steps of:
    (1) coating a substrate with a film of a polymer that contains a masked reactive functionality;
    (2) imagewise exposing said film to radiation under conditions that cause unmasking of the reactive functionality in the exposed regions of the film;
    (3) treating the exposed film with a reactive organometallic reagent; and
    (4) developing the relief image by treatment with an oxygen plasma.

2. A process as claimed in claim 1 wherein the masking group is removed directly by exposure to radiation.

3. A process as claimed in claim 1 wherein the polymer contains an acid labile group pendant from the polymer backbone, and the film contains a monomeric species that liberates acid upon exposure.

4. A process as claimed in claim 2 wherein the polymer is poly(p-formyloxystyrene).

5. A process as claimed in claim 3 wherein the polymer is poly(t-butylmethacrylate).

6. A process as claimed in claim 3 wherein the polymer is poly(t-butyloxycarbonyloxy styrene).

7. A process as claimed in claim 3 wherein the monomeric species is an onium salt.

8. A process as in claim 3 wherein the monomeric species is triphenylsulfonium hexafluoroarsenate.

9. A process as claimed in claim 3 wherein the monomeric species is triphenylsulfonium hexafluoroantimonate.

10. A process as claimed in claim 1 wherein the organometallic reagent is an organosilane.

11. A process as claimed in claim 1 wherein the organometallic reagent is an organostannane.

12. A process as claimed in claim 1 wherein the organometallic reagent is hexamethyldisilazane.

13. A process as claimed in claim 1 wherein the organometallic reagent is trimethyl silyl chloride.

14. A process as claimed in claim 1 wherein a thick film of unsensitized polymer is positioned between the substrate and the film of polymer containing a masked reactive functionality.

* * * * *